United States Patent
Chen et al.

(10) Patent No.: US 7,199,383 B2
(45) Date of Patent: Apr. 3, 2007

(54) METHOD FOR REDUCING PARTICLES DURING ION IMPLANTATION

(75) Inventors: Jui-Fang Chen, Tai-Chung Hsien (TW); Cheng-Hung Chang, Hsin-Chu Hsien (TW); Chung-Shih Shen, Hsin-Chu (TW); Chung-Jung Chen, Hsin-Chu (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 11/161,995

(22) Filed: Aug. 25, 2005

(65) Prior Publication Data

US 2007/0045568 A1    Mar. 1, 2007

(51) Int. Cl.
*H01J 37/317* (2006.01)
*H01J 37/08* (2006.01)
*G21G 5/00* (2006.01)
*A21N 5/00* (2006.01)

(52) U.S. Cl. ............ 250/492.21; 250/397; 250/492.1; 250/492.2; 250/492.23; 250/492.3

(58) Field of Classification Search ............ 250/492.21
See application file for complete search history.

(56) References Cited

U.S. PATENT DOCUMENTS

| | | | | |
|---|---|---|---|---|
| 5,378,899 A | * | 1/1995 | Kimber | 250/492.21 |
| 5,554,854 A | * | 9/1996 | Blake | 250/492.21 |
| 5,656,092 A | * | 8/1997 | Blake et al. | 118/723 VE |
| 5,670,217 A | * | 9/1997 | Blake et al. | 427/476 |
| 5,998,798 A | * | 12/1999 | Halling et al. | 250/492.21 |
| 6,221,169 B1 | * | 4/2001 | Bernstein et al. | 134/2 |
| 6,720,563 B1 | * | 4/2004 | Kabasawa | 250/492.21 |

* cited by examiner

*Primary Examiner*—David A. Vanore
*Assistant Examiner*—Bernard Souw
(74) *Attorney, Agent, or Firm*—Winston Hsu

(57) ABSTRACT

A method for reducing particles during ion implantation is provided. The method involves the use of an improved Faraday flag including a beam plate having thereon a beam striking zone comprising a recessed trench pattern on which the ion beam scans to and fro. An ion beam selected from the mass analyzer is blocked by the Faraday flag in a closed position between the mass analyzer and the semiconductor wafer. A beam current of the ion beam impinging on the beam striking zone of the beam plate is measured. After the beam current measurement, the Faraday flag is removed such that the ion beam impinges on the semiconductor wafer.

19 Claims, 4 Drawing Sheets

METHOD FOR REDUCING PARTICLES DURING ION IMPLANTATION

BACKGROUND OF THE INVENTION

1. Field of the Invention

The present invention relates generally to the field of semiconductor fabrication and, more particularly, to a method for reducing particles during ion implantation.

2. Description of the Prior Art

Ion implanters are commonly used in the manufacture of semiconductor products for implanting ions into semiconductor substrates to change the conductivity of the material in such substrates or in pre-defined regions thereof. A typical implanter consists of an ion source, a mass analyzer, a Faraday flag, an electron shower, and a disk assembly. The ion source supplies the ions to be implanted. These ions can be of several different chemical elements and pass through a magnetic field in the mass analyzer. Based on the mass to charge ratio of the generated ions, the mass analyzer selects certain ions to reach the target wafer for implantation.

The Faraday flag is a monitoring assembly for measurement and setup prior to implanting. Typically made of graphite, the Faraday flag is used to block the ion stream before implantation begins and is physically moved to allow the ions to reach the target wafer during implantation. In the closed position, the Faraday flag blocks the ion beam and implements direct measurement of beam currents.

Typically, the Faraday flag encompasses a graphite beam plate with a flat surface. When the Faraday flag is disposed in the aforesaid closed position, the ion beam impinges on the flat surface and the ion implanter begins to measure the beam current of the ion beam. During the measurement of the beam current, dopant species such as phosphorus, germanium or boron deposit and accumulate on the flat surface of the beam plate, and gradually forms a material film thereon. This is problematic because the material film deposited on the flat surface of the graphite beam plate becomes a contamination source.

According to the prior art, particles resulting from beam strike on the material film deposited on the flat surface of the graphite beam plate readily escape out of the Faraday flag and thus contaminate the ion beam. In a worst case, the accelerated particles chipped off from the flat surface of the graphite beam plate might severely damage the circuit features such as polysilicon gate lines formed on the semiconductor wafer.

In light of the above, a need exists for an improved ion implant method and an improved design of the Faraday flag that are capable of reducing particle problem and substantially eliminating damage to the wafer.

SUMMARY OF THE INVENTION

It is the primary object of the present invention to provide an improved method for reducing particles during ion implantation.

According to the claimed invention, a method for reducing particles during ion implantation is provided. The method includes the steps of:

(1) loading a semiconductor wafer into an ion implanter, the ion implanter comprising an ion source, a mass analyzer, a disk assembly for holding the semiconductor wafer;

(2) blocking an ion beam selected from the mass analyzer by interposing a movable Faraday flag between the mass analyzer and the semiconductor wafer to a closed position, wherein the Faraday flag comprises a beam plate having thereon a beam striking zone comprising a recessed trench pattern on which the ion beam scans to and fro;

(3) measuring a beam current of the ion beam impinging on the beam striking zone of the beam plate; and (4) removing the Faraday flag such that the ion beam impinges on the semiconductor wafer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Figure 1:
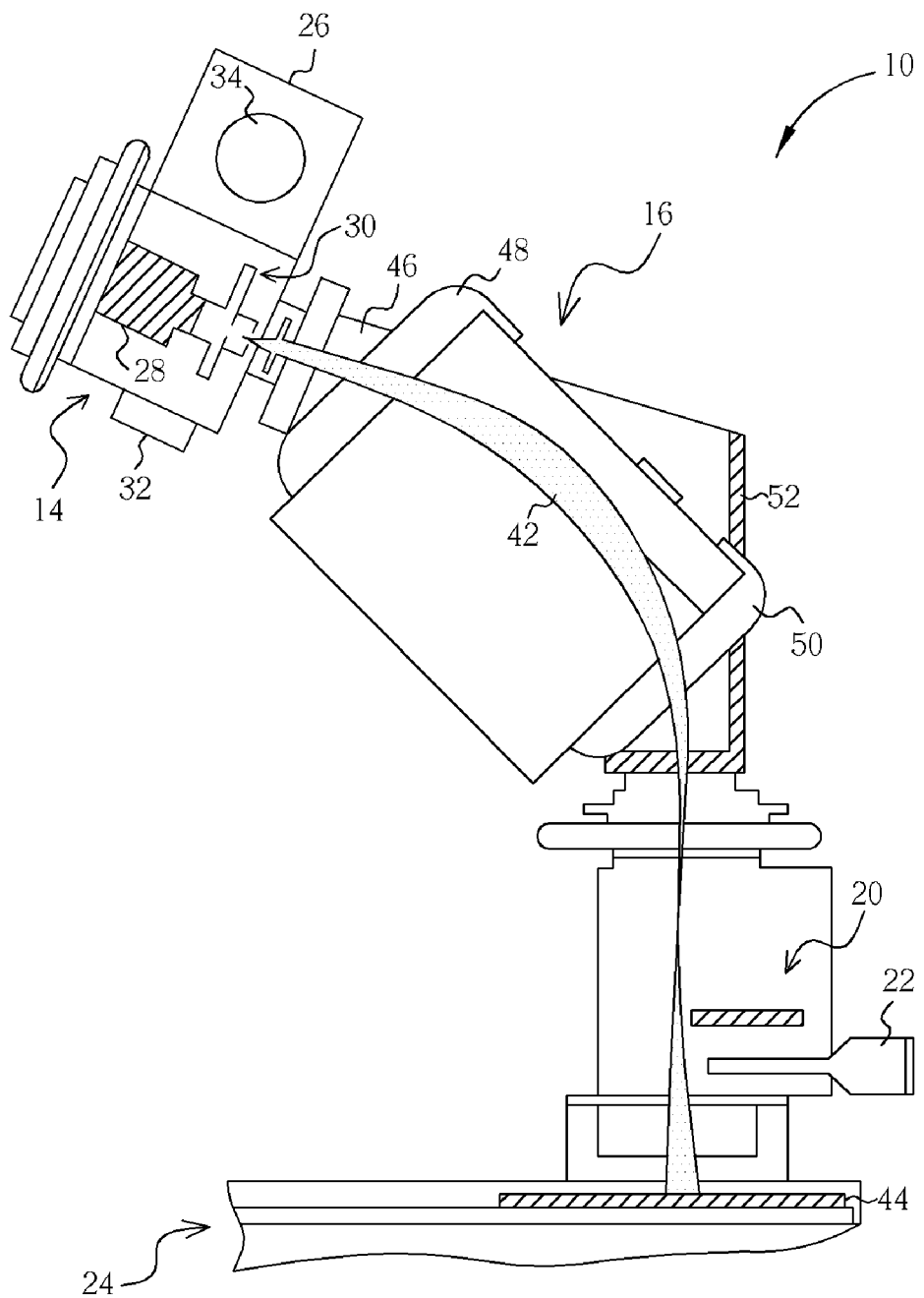
FIG. 1 is a schematic, cross-sectional diagram illustrating an ion implanter with Faraday flag disposed in an open position in accordance with the present invention.
Figure 2:
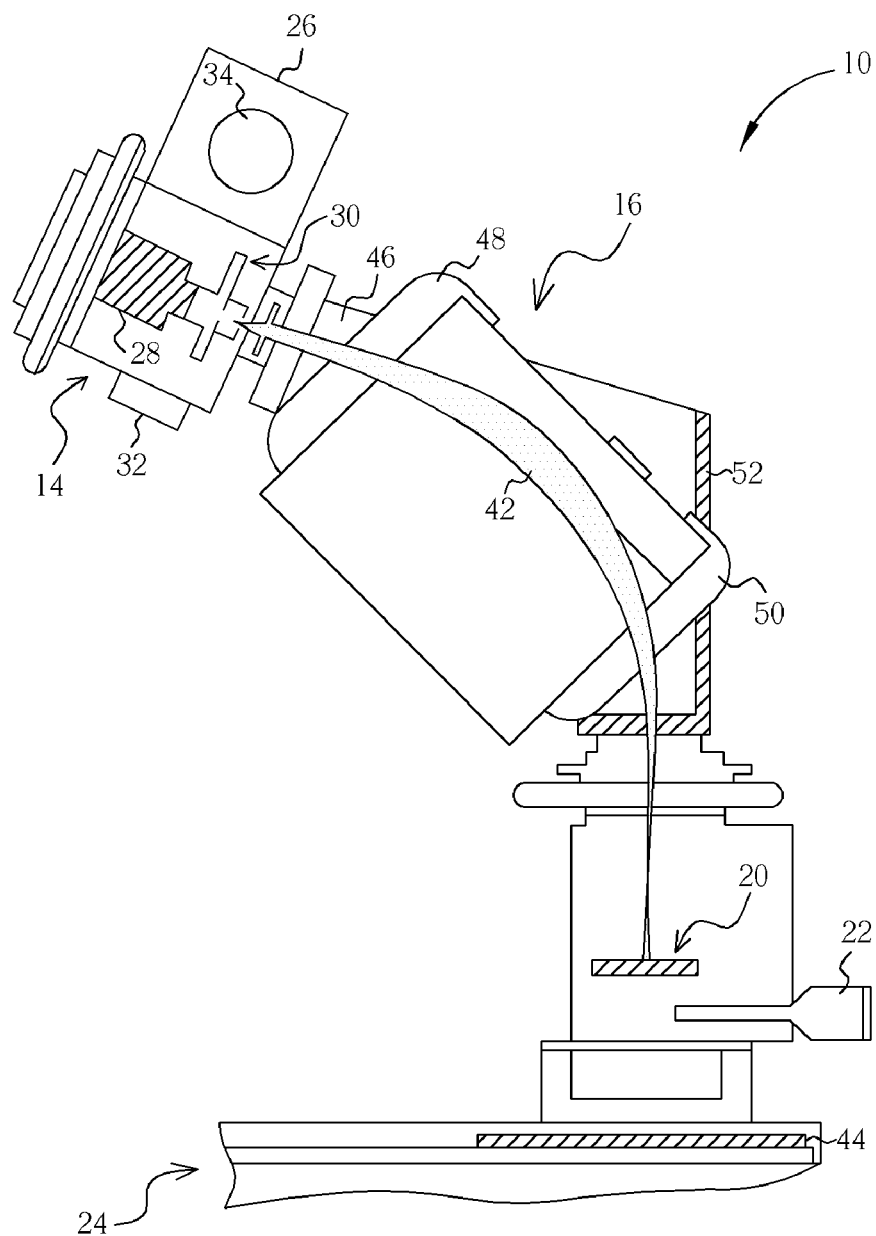
FIG. 2 is a schematic, cross-sectional diagram illustrating the ion implanter with Faraday flag disposed in a closed position in accordance with the present invention.

Please refer to FIG. 1 and FIG. 2, wherein FIG. 1 is a schematic, cross-sectional diagram illustrating an ion implanter 10 with a Faraday flag 20 disposed in an open position in accordance with one preferred embodiment of the present invention, while FIG. 2 illustrates the Faraday flag 20 in a closed position. According to the preferred embodiment of this invention, the ion implanter 10 is a high-current ion implanter that provides an ion beam with a dosage of greater than or equal to 1 E 14 atoms/cm$^2$ and energy of about 20 eV to 200 KeV. Generally, the ion implanter 10 includes a source assembly 14, a beam guide assembly 16, a Faraday flag 20, a means for neutralizing ion beams such as an electron shower or a plasma flood gun 22, and a disk or target wafer processing assembly 24. In another case, the ion implanter 10 may further comprise a post-acceleration assembly (not explicitly shown). In such case, the Faraday flag 20 may be mounted in the housing of the post-acceleration assembly.

The source assembly 14 includes a housing 26, an ion source 28, an extraction electrode assembly 30, an electrode manipulator 32 and a diffusion pump 34. The beam guide assembly 16, which directs an ion beam 42 along an arcuate path to a target wafer 44 supported in the disk processing assembly 24, includes a beam guide 46, two analyzer magnetic coils 48, 50 positioned above and below the beam guide 46, respectively and a striker plate 52. The ions in the ion beam 42 are selectively deflected on the basis of their charge to mass ratio by the analyzer magnetic coils 48, 50.

The Faraday flag 20 is disposed between the beam guide assembly 16 and the target wafer processing assembly 24. The Faraday flag 20 is selectively moveable between an open position (FIG. 1) and a closed position (FIG. 2). In the closed position, the Faraday flag 20 blocks the ion beam 42 from contact with the target wafer 44 and can directly measure beam currents of the ion beam 42. In the open position, the Faraday flag 20 permits the ion beam 42 to reach and make contact with the target wafer 44.

According to the preferred embodiment of this invention, the Faraday flag 20 comprises a beam plate having thereon a beam striking zone. The Faraday flag 20 may further comprise a casing that wraps the beam plate. The casing has an aperture that exposes the beam striking zone of the beam plate to the ion beam. The beam plate is made of a piece of graphite. The casing may be made of metal such as aluminum. The beam striking zone comprises at least one particle trapping feature. According to this invention, the particle trapping feature is a recessed trench pattern that is formed within the beam striking zone.

Figure 3:
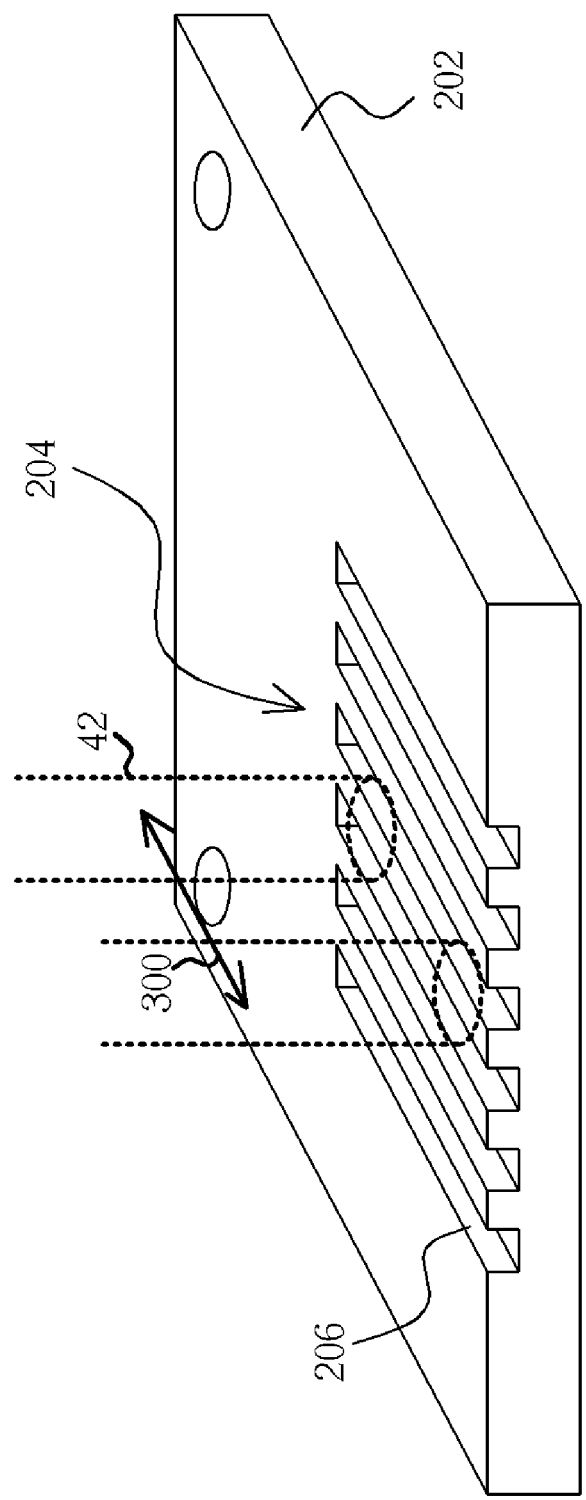
FIG. 3 is a perspective, cross-sectional view showing recessed trench pattern and beam striking zone of the beam plate of the Faraday flag in accordance with one embodiment of this invention.

Please refer to FIG. 3. FIG. 3 is a perspective, cross-sectional view showing recessed trench pattern and beam striking zone of the beam plate of the Faraday flag in accordance with one embodiment of this invention. The beam plate 202 comprises a plurality of recessed trenches 206 formed within the beam striking zone 204. When the Faraday flag 20 is disposed in the closed position for beam current measurement, the ion beam 42 impinges upon the beam plate 202 and scans the recessed trenches 206 in the direction as indicated by the to and fro arrow 300. The sputtered particles resulting from beam strike on the beam plate can be trapped at the bottoms of the recessed trenches 206 and thus preventing the particles from falling out into the wafer processing assembly 24. The depth of the recessed trenches 206 ranges between 5% and 90% of the thickness of the beam plate 202. Preferably, the depth of the recessed trenches 206 is about 50% of the thickness of the beam plate 202.

Compared to the prior art, the material film deposited on the beam plate is thinner due to that the surface area of the beam striking zone is increased. By doing this, the maintenance period can be extended.

Figure 4:
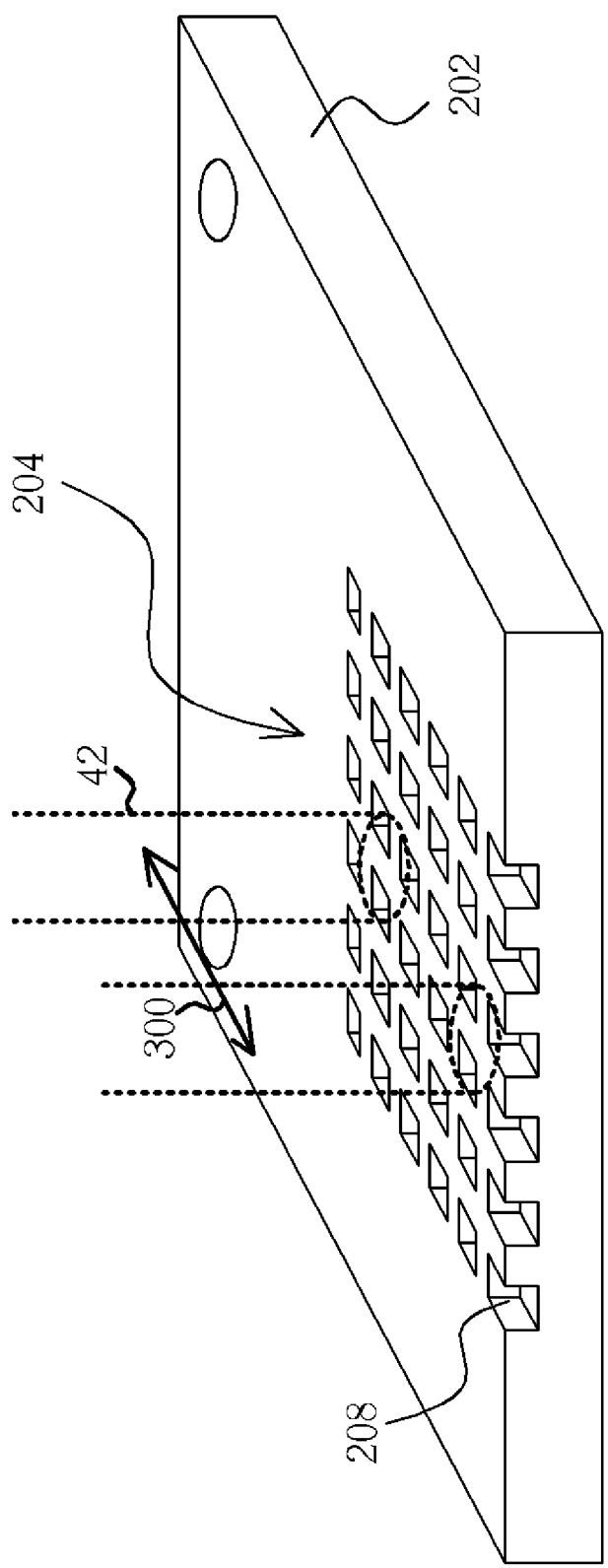
FIG. 4 is a perspective, cross-sectional view showing recessed trench pattern and beam striking zone of the beam plate of the Faraday flag in accordance with another embodiment of this invention.

FIG. 4 is a perspective, cross-sectional view showing recessed trench pattern and beam striking zone of the beam plate of the Faraday flag in accordance with another embodiment of this invention. The beam plate 202 comprises a plurality of recessed features 208 formed within the beam striking zone 204. When the Faraday flag 20 is disposed in the closed position for beam current measurement, the ion beam 42 impinges upon the beam plate 202 and scans the recessed features 208 in the direction as indicated by the to and fro arrow 300. The sputtered particles resulting from beam strike on the beam plate can be trapped at the bottoms of the recessed features 208 and thus preventing the particles from falling out into the wafer processing assembly 24.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for reducing particles during ion implantation, comprising:
    loading a semiconductor wafer into an ion implanter, said ion implanter comprising an ion source, a mass analyzer, a disk assembly for holding said semiconductor wafer;
    blocking an ion beam selected from said mass analyzer by interposing a movable Faraday flag between said mass analyzer and said semiconductor wafer to a closed position, wherein said Faraday flag comprises a beam plate having thereon a beam striking zone comprising a plurality of recessed trenches on which said ion beam scans to and fro; wherein said ion beam impinges upon said plurality of recessed trenches and wherein sputtered particles resulting from beam strike on said beam plate are trapped at bottoms of said recessed trenches and thus preventing said sputtered particles from falling out of said Faraday flag;
    measuring a beam current of said ion beam impinging on said beam striking zone of said beam plate; and
    removing said Faraday flag such that said ion beam impinges on said semiconductor wafer.

2. The method according to claim 1 wherein said ion implanter further comprises a means for neutralizing said ion beam.

3. The method according to claim 2 wherein said means for neutralizing said ion beam is a plasma flood gun.

4. The method according to claim 2 wherein said means for neutralizing said ion beam is an electron shower.

5. The method according to claim 1 wherein said beam plate is made of graphite.

6. The method according to claim 1 wherein particles resulting from beam strike on said beam plate are trapped in said recessed trench pattern.

7. The method according to claim 1 wherein said ion implanter is a high-current ion implanter.

8. The method according to claim 1 wherein said ion beam has a dosage of greater than or equal to 1 E 14 atoms/$cm^2$.

9. The method according to claim 1 wherein said ion beam has energy of about 20 eV to 200 KeV.

10. A method for reducing particles during ion implantation, comprising:
    loading a semiconductor wafer into an ion implanter, said ion implanter comprising an ion source, a mass analyzer, a disk assembly for holding said semiconductor wafer;
    blocking an ion beam selected from said mass analyzer by interposing a movable Faraday flag between said mass analyzer and said semiconductor wafer to a closed position, wherein said Faraday flag comprises a beam plate having a plurality of recessed trenches on which said ion beam scans to and fro; wherein said ion beam impinges upon said plurality of recessed trenches and wherein sputtered particles resulting from beam strike on said beam plate are trapped at bottoms of said recessed trenches and thus preventing said sputtered particles from falling out of said Faraday flag; and wherein said recessed trenches increase surface area of said beam striking zone thereby reducing thickness of material film deposited on said beam plate; and wherein said beam plate is wrapped by a casing that has an aperture exposing said beam striking zone;
    measuring a beam current of said ion beam impinging on said beam plate; and removing said Faraday flag such that said ion beam impinges on said semiconductor wafer.

11. The method according to claim 10 wherein said ion implanter further comprises a means for neutralizing said ion beam.

12. The method according to claim 11 wherein said means for neutralizing said ion beam is a plasma flood gun.

13. The method according to claim 11 wherein said means for neutralizing said ion beam is an electron shower.

14. The method according to claim 10 wherein said beam plate is made of graphite.

15. The method according to claim 10 wherein said particle trapping feature is a recessed trench.

16. The method according to claim 15 wherein particles resulting from beam strike on said beam plate are trapped in said recessed trench.

17. The method according to claim 10 wherein said ion implanter is a high-current ion implanter.

18. The method according to claim 10 wherein said ion beam has a dosage of greater than or equal to 1 E 14 atoms/cm$^2$.

19. The method according to claim 10 wherein said ion beam has energy of about 20 eV to 200 KeV.

* * * * *